United States Patent
Morita et al.

(10) Patent No.: US 11,710,996 B2
(45) Date of Patent: Jul. 25, 2023

(54) COIL SUBSTRATE AND MOTOR COIL SUBSTRATE

(71) Applicant: IBIDEN CO., LTD., Gifu (JP)

(72) Inventors: Haruhiko Morita, Ogaki (JP); Hitoshi Miwa, Ogaki (JP); Shinobu Kato, Ogaki (JP); Toshihiko Yokomaku, Ogaki (JP); Hisashi Kato, Ogaki (JP); Takahisa Hirasawa, Ogaki (JP); Tetsuya Muraki, Ogaki (JP); Takayuki Furuno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/445,750

(22) Filed: Aug. 24, 2021

(65) Prior Publication Data
US 2022/0078912 A1   Mar. 10, 2022

(30) Foreign Application Priority Data
Sep. 4, 2020   (JP) .................................. 2020-148920

(51) Int. Cl.
*H02K 3/28* (2006.01)
*H05K 1/11* (2006.01)
*H02K 3/26* (2006.01)
*H02K 1/06* (2006.01)
*H02K 3/04* (2006.01)
*H02K 15/04* (2006.01)
*H01F 5/00* (2006.01)

(52) U.S. Cl.
CPC .................. *H02K 3/28* (2013.01); *H02K 1/06* (2013.01); *H02K 3/04* (2013.01); *H02K 3/26* (2013.01); *H02K 15/0407* (2013.01); *H05K 1/118* (2013.01); *H01F 5/003* (2013.01); *H02K 2203/03* (2013.01); *H02K 2211/03* (2013.01); *H05K 2201/10265* (2013.01)

(58) Field of Classification Search
CPC .......... H01F 5/003; H02K 1/06; H02K 15/00; H02K 15/0407; H02K 2203/03; H02K 2211/03; H02K 3/04; H02K 3/26; H02K 3/28; H05K 1/118; H05K 2201/10265
USPC ..................................................... 310/71, 208
See application file for complete search history.

(56) References Cited

U.S. PATENT DOCUMENTS 4,271,370 A * 6/1981 DiMeo ..................... H02K 3/26
                                                    336/200
4,677,332 A * 6/1987 Heyraud .................. H02K 3/04
                                                    310/DIG. 6
(Continued)

FOREIGN PATENT DOCUMENTS

JP    2019-140762 A    8/2019

*Primary Examiner* — Rashad H Johnson
(74) *Attorney, Agent, or Firm* — Oblon, McClelland, Maier & Neustadt, L.L.P.

(57) ABSTRACT

A coil substrate includes a flexible substrate having a first end and a second end on the opposite side with respect to the first end, and coils formed on the flexible substrate such that the coils are positioned substantially in a row between the first end and second end of the flexible substrate. The coils are formed such that the number of coils is K and that the coils include the first coil positioned close to the first end and the K-th coil positioned to form a predetermined distance between the K-th coil and the second end, where K is an integer equal to or greater than 2.

20 Claims, 3 Drawing Sheets

(56) References Cited

U.S. PATENT DOCUMENTS

| | | | | |
|---|---|---|---|---|
| 6,144,281 | A * | 11/2000 | Lorris | H01F 5/003 336/200 |
| 6,373,153 | B1 * | 4/2002 | Hazelton | H02K 3/04 310/12.22 |
| 2003/0080631 | A1 * | 5/2003 | Kageyama | G03F 7/70758 310/12.22 |
| 2003/0193386 | A1 * | 10/2003 | Tseng | H01F 27/2804 336/200 |
| 2011/0133591 | A1 * | 6/2011 | Yan | H02K 3/47 310/198 |
| 2011/0140564 | A1 * | 6/2011 | Nomura | H01F 41/041 336/200 |
| 2012/0126927 | A1 * | 5/2012 | Iwaya | H01F 5/003 336/200 |
| 2016/0314892 | A1 * | 10/2016 | Fukushima | H01F 17/0013 |
| 2018/0040419 | A1 * | 2/2018 | Dardona | H01F 27/2804 |
| 2018/0145653 | A1 * | 5/2018 | Ishizuka | H01F 27/42 |
| 2018/0277293 | A1 * | 9/2018 | Ito | H01F 17/0013 |
| 2018/0323133 | A1 * | 11/2018 | Kirby | H01L 23/481 |
| 2018/0374630 | A1 * | 12/2018 | Morita | H01F 27/2847 |
| 2019/0115130 | A1 * | 4/2019 | Morita | H01F 27/2804 |
| 2019/0139691 | A1 * | 5/2019 | Mayumi | H01F 27/24 |
| 2019/0148053 | A1 * | 5/2019 | Kaneko | H01F 5/04 336/192 |
| 2019/0245401 | A1 * | 8/2019 | Morita | H02K 13/006 |
| 2019/0273422 | A1 * | 9/2019 | Kim | H02K 21/24 |
| 2019/0304655 | A1 * | 10/2019 | Hirukawa | H01F 27/2804 |
| 2019/0304670 | A1 * | 10/2019 | Chiyo | H01F 27/2804 |
| 2020/0161919 | A1 * | 5/2020 | Morita | H02K 3/26 |
| 2020/0203831 | A1 * | 6/2020 | Ichikawa | H02J 50/12 |
| 2020/0286678 | A1 * | 9/2020 | Morita | H01F 27/06 |
| 2020/0381167 | A1 * | 12/2020 | Moriki | H01F 27/2804 |
| 2020/0381802 | A1 * | 12/2020 | Matsushima | H03H 7/38 |
| 2021/0066982 | A1 * | 3/2021 | Morita | H02K 3/47 |
| 2021/0272738 | A1 * | 9/2021 | Chiyo | H01F 27/2871 |
| 2022/0059266 | A1 * | 2/2022 | Saito | H01F 41/041 |
| 2022/0102043 | A1 * | 3/2022 | Tsutsui | H01F 17/0013 |
| 2022/0102044 | A1 * | 3/2022 | Okumura | H01F 27/292 |
| 2022/0102045 | A1 * | 3/2022 | Okumura | H01F 27/29 |
| 2022/0110210 | A1 * | 4/2022 | Morita | H05K 1/0277 |
| 2022/0115927 | A1 * | 4/2022 | Morita | H02K 3/28 |
| 2022/0122758 | A1 * | 4/2022 | Kim | H01F 41/041 |
| 2022/0247453 | A1 * | 8/2022 | Chiyo | H02J 7/0044 |
| 2022/0285077 | A1 * | 9/2022 | Ogasawara | H01F 27/2804 |
| 2022/0285841 | A1 * | 9/2022 | Kaji | H01Q 5/10 |

* cited by examiner

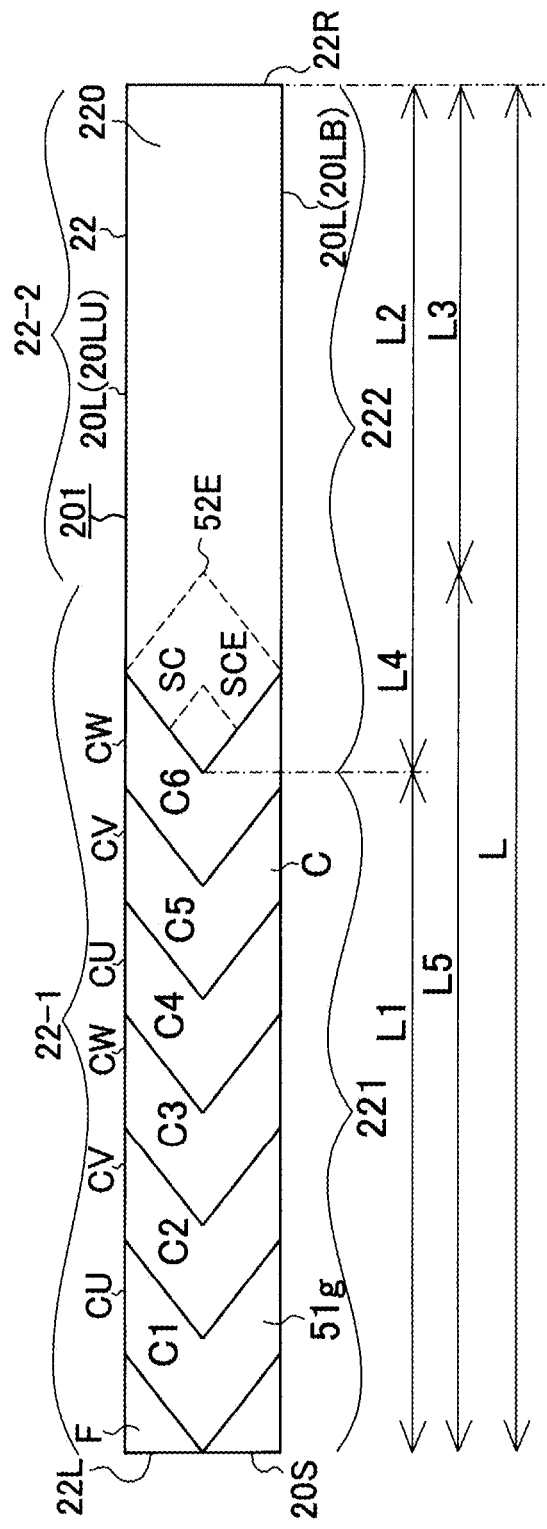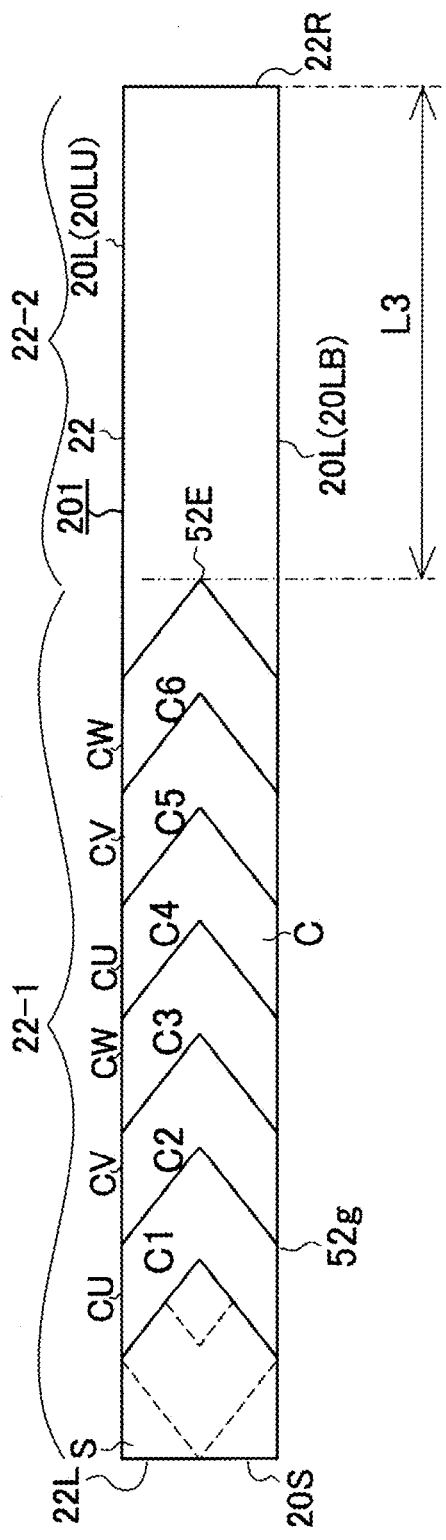

COIL SUBSTRATE AND MOTOR COIL SUBSTRATE

CROSS-REFERENCE TO RELATED APPLICATIONS

The present application is based upon and claims the benefit of priority to Japanese Patent Application No. 2020-148920, filed Sep. 4, 2020, the entire contents of which are incorporated herein by reference.

BACKGROUND OF THE INVENTION

Field of the Invention

The present invention relates to a coil substrate and a motor coil substrate.

Description of Background Art

Japanese Patent Application Laid-Open Publication No. 2019-140762 describes a motor coil substrate. The entire contents of this publication are incorporated herein by reference.

SUMMARY OF THE INVENTION

According to one aspect of the present invention, a coil substrate includes a flexible substrate having a first end and a second end on the opposite side with respect to the first end, and coils formed on the flexible substrate such that the coils are positioned substantially in a row between the first end and second end of the flexible substrate. The coils are formed such that the number of coils is K and that the coils include the first coil positioned close to the first end and the K-th coil positioned to form a predetermined distance between the K-th coil and the second end, where K is an integer equal to or greater than 2.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B illustrate a coil substrate according to an embodiment of the present invention;

DETAILED DESCRIPTION OF THE EMBODIMENTS

Figure 1A:
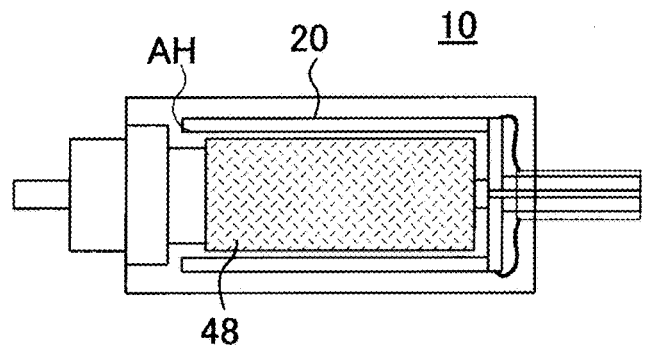
FIG. 1A is a schematic diagram of a motor according to an embodiment of the present invention.

Embodiments will now be described with reference to the accompanying drawings, wherein like reference numerals designate corresponding or identical elements throughout the various drawings.

A coil substrate 201 illustrated in FIGS. 2A and 2B is prepared. As illustrated in FIGS. 2A and 2B, the coil substrate 201 is formed to include: a flexible substrate 22 having a first surface (F) and a second surface (S) on the opposite side with respect to the first surface (F); and coils (C) on the flexible substrate 22. Further, the flexible substrate 22 has short sides (20S) and long sides (20L). The flexible substrate 22 has one end (22L) and the other end (22R) on the opposite side with respect to the one end (22L). The one end (22L) also serves as one of the short sides (20S). The long sides (20L) include an upper side (20LU) and a lower side (20LB) on the opposite side with respect to the upper side (20LU). The number of the coils (C) is M. M is an integer equal to or greater than 2. A maximum value of M is K. In the example of FIGS. 2A and 2B, the number of the coils (C1, C2 C3, C4, C5, C6) is 6. The coils (C) are schematically illustrated. FIG. 2A illustrates the coils (C) on the first surface (F), and FIG. 2B illustrates the coils (C) on the second surface (5).

Figure 1B:
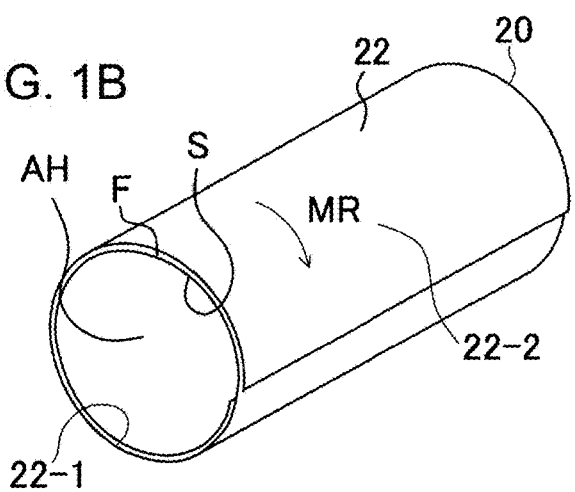
FIG. 1B is a schematic diagram of a motor coil substrate according to an embodiment of the present invention.
Figure 1C:
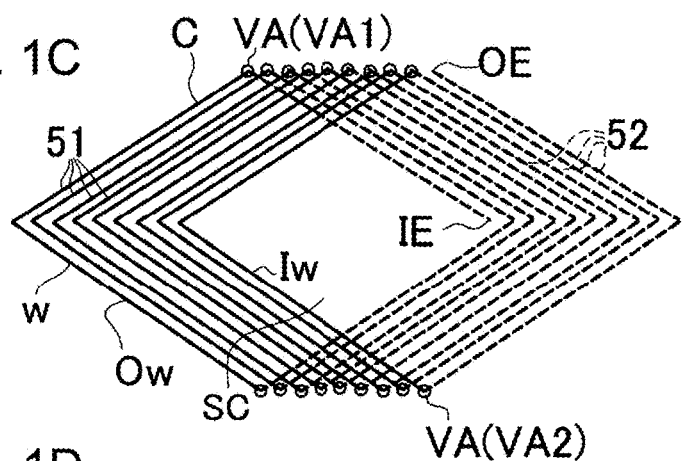
FIG. 1C is a plan view of wirings according to an embodiment of the present invention.

FIG. 1C illustrates an example of a coil (C). The coil (C) is formed of a central space (SC) and wirings (w) surrounding the central space (SC). The wirings (w) have an outer end (OE) and an inner end (IE). The wirings (w) are formed between the outer end (OE) and the inner end (IE). The wirings (w) forming the coil (C) are formed in a spiral shape.

As illustrated in FIG. 1C, the wirings (w) are formed to include multiple first circuits 51, multiple second circuits 52, and multiple via conductors (VA). As illustrated in FIG. 3B, the first circuits 51 are formed on the first surface (F), and the second circuits 52 are formed on the second surface (5). The via conductors (VA) penetrate the flexible substrate 22. The first circuits 51 and the second circuits 52 are connected via the via conductors (VA). One first circuit 51, one second circuit 52 and one via conductor (VA) form substantially a 1-turn coil. Among the wirings (w) that form one turn, the first circuit 51 is close to the one end (22L) and the second circuit 52 is close to the other end (22R). The multiple via conductors (VA) are divided into first via conductors (VA1) and second via conductors (VA2). The first via conductors (VA1) are close to the upper side (20LU), and the second via conductors (VA2) are close to the lower side (20LB). The first circuits 51, the second circuits 52, and the via conductors (VA) are connected in the order of the first circuits 51, the second via conductors (VA2), the second circuits 52, and the first via conductors (VA1). Wirings (w) forming adjacent turns are connected via the first via conductors (VA1).

Figure 1D:
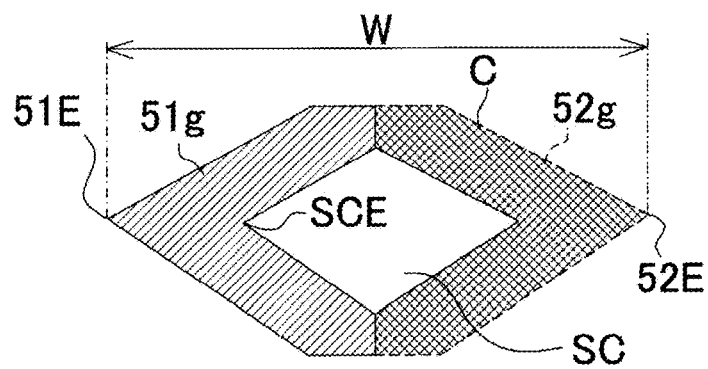
FIG. 1D is a plan view of a coil according to an embodiment of the present invention.

In FIG. 1D, the wirings (w) are grouped. By grouping the first circuits 51, a first circuit group (51g) is formed. By grouping the second circuits 52, a second circuit group (52g) is formed. The coils (C) in FIGS. 2A and 2B are drawn using the first circuit groups (51g) and the second circuit groups (52g).

As illustrated in FIG. 1D, the coil (C) has a one end (51E) and the other end (52E). The one end (51E) of the coil (C) is closest to the one end (22L) of the flexible substrate 22. The other end (52E) of the coil (C) is closest to the other end (22R) of the flexible substrate 22. A distance between the one end (51E) of the coil (C) and the other end (52E) of the coil (C) is a width (W) of the coil (C). The coils (C) have substantially the same width.

The coils (C) of the embodiment are formed using a technology for a printed wiring board. The wirings (w) forming the coils (C) are formed by plating. Or, the wirings (w) forming the coils (C) are formed by etching a copper foil. The wirings (w) forming the coils (C) are formed using a semi-additive method, an M-Sap method, or a subtractive method.

The wirings (w) forming the coils (C) are formed using a technology for a printed wiring board. Therefore, a cross-sectional shape of each of the wirings (w) is substantially rectangular. According to the embodiment, a space factor of the coils can be increased.

The multiple coils (C) formed on the flexible substrate 22 are simultaneously formed. For example, the multiple coils (C) are formed on the flexible substrate 22 using a common alignment mark. Therefore, positions of the coils (C) are related to each other.

Figure 3A:
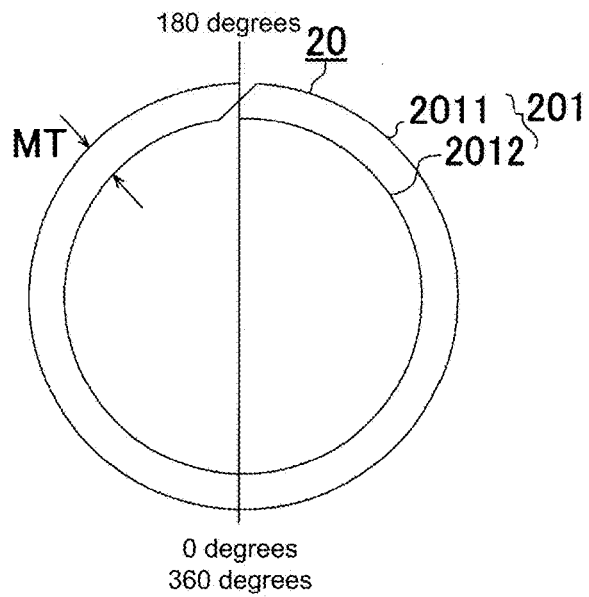
FIG. 3A is a schematic cross-sectional view of a motor coil substrate according to an embodiment of the present invention.
Figure 3D:
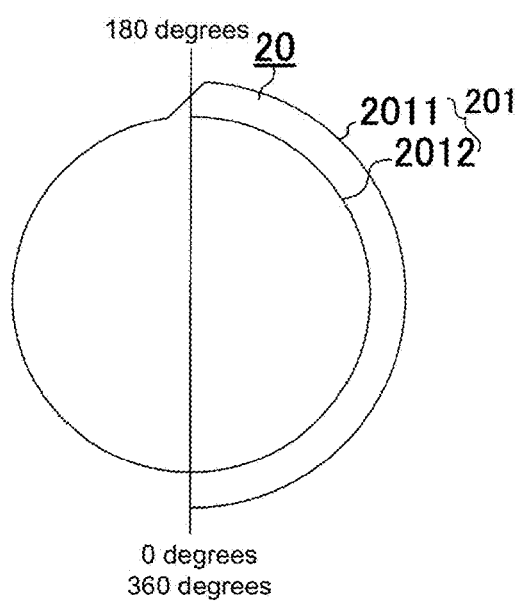
FIG. 3D is a schematic cross-sectional view of a motor coil substrate of a reference example.
Figure 3B:
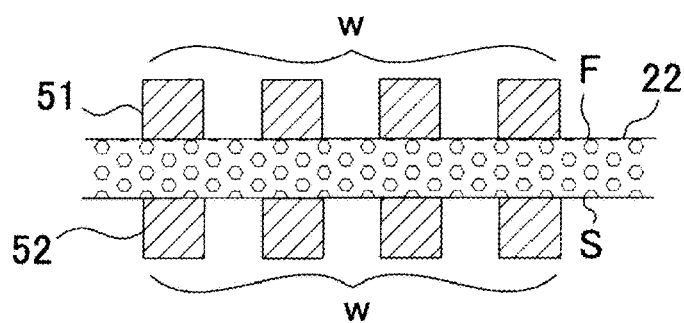
FIG. 3B illustrates a cross section of a coil substrate according to an embodiment of the present invention.
Figure 3C:
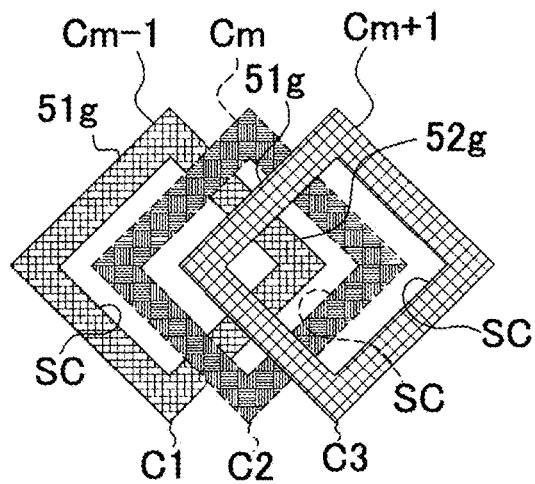
FIG. 3C is a schematic diagram illustrating overlapping of coils according to an embodiment of the present invention.

FIG. 3C illustrates overlapping of the m-th coil (Cm), the (m+1)-th coil (Cm+1), and the (m−1)-th coil (Cm−1). When m is 2, the m-th coil (Cm) is the second coil (C2), the (m+1)-th coil (Cm+1) is the third coil (C3), and the (m−1)-th coil (Cm−1) is the first coil (C1). In the example of FIG. 3C, m is 2.

The second circuit group (52g) of the (m−1)-th coil (Cm−1) is positioned below the central space (SC) of the m-th coil (Cm), and the first circuit group (51g) of (m+1)-th coil (Cm+1) is positioned above the central space (SC) of the m-th coil (Cm). In FIG. 3C, an outer periphery of the central space (SC) of the m-th coil (Cm) is drawn using a dotted line. A density of the wirings (w) forming the coils (C) can be increased. A space factor of the coils (C) can be increased. A torque of a motor can be increased.

The coils (C) include U-phase coils (CU), V-phase coils (CV), and W-phase coils (CW). The U-phase coils (CU), the V-phase coils (CV), and W-phase coil (CW) are in the order of a U-phase coil (CU), a V-phase coil (CV), and a W-phase coil (CW). The coil (C) closest to the one end (22L) is a U-phase coil (CU).

The coil substrate 201 is formed of a single flexible substrate 22. The coils (C) are formed along the long sides (20L) of the flexible substrate 22. The coil (C) closest to the one end (22L) is the first coil (C1). The coil closest to the other end (22R) is the K-th coil (CK). The coils (C) are formed in order from the first coil (C1) to the K-th coil (CK). The coils (C) are formed in one row from the one end (22L) to the other end (22R) of the flexible substrate 22. However, as illustrated in FIGS. 2A and 2B, the coils (C) are not evenly positioned. The coils (C) are not formed in a predetermined region 220 including the other end (22R). The predetermined region 220 is referred to as a predetermined interval 220. The predetermined interval 220 is formed between the K-th coil (CK) and the other end (22R). The flexible substrate 22 forming the predetermined interval 220 is a sub portion (22-2). The flexible substrate 22 excluding the sub portion (22-2) is a main portion (22-1). The flexible substrate 22 is formed of the main portion (22-1) and the sub portion (22-2). The sub portion (22-2) extends from the main portion (22-1). The coils (C) are formed on the main portion (22-1). The coils (C) are not formed on the sub portion (22-2).

In the example of FIGS. 2A and 2B, the 6 coils (C) are positioned from the one end (22L) toward the other end (22R). The coils (C) from the first coil (C1) to the sixth coil (C6) are formed on the main portion (22-1).

As illustrated in FIGS. 2A and 2B, a length of the flexible substrate 22 is L. A length of the main portion (22-1) is L5. The length (L5) is a distance between the one end (22L) and the other end (52E) of the K-th coil (CK). A length of the sub portion (22-2) is L3. The length (L3) is a distance between the other end (52E) of the K-th coil (CK) and the other end (22R) of the flexible substrate 22. The length (L) is a sum of the length (L5) and the length (L3). Since the flexible substrate 22 of the embodiment has the predetermined interval 220, the length (L) of the coil substrate 201 can be freely adjusted.

By winding the coil substrate 201, a motor coil substrate 20 illustrated in FIG. 1B is obtained. For example, the coil substrate 201 is wound in a tubular shape. The motor coil substrate 20 is wound around a hollow space (AH). For example, the motor coil substrate 20 has a tubular shape. The number of windings (N) is 2 or more and 3 or less. N is 2 or larger. FIG. 1B is a schematic diagram.

When the coil substrate 20 formed of the main portion (22-1) and the sub portion (22-2) is wound, as illustrated in FIG. 1B, the sub portion (22-2) is wound on an outer side of the main portion (22-1).

As illustrated in FIG. 1B, the flexible substrate 22 is wound for 2 or more turns. When the flexible substrate 22 is observed from a viewpoint of the motor coil substrate 20, the flexible substrate 22 can be considered as a collection of flexible substrates that respectively form the turns. In the motor coil substrate 20, the flexible substrate positioned on the innermost side is the flexible substrate of the first turn. The flexible substrate of the first turn is a first flexible substrate 221. The flexible substrate of the second turn is a second flexible substrate 222. The second flexible substrate 222 extends from the first flexible substrate 221. Further, the second flexible substrate 222 is wound around the first flexible substrate 221. In this way, the flexible substrate 22 that forms the motor coil substrate 20 is formed of the first to N-th flexible substrates. The N-th flexible substrate (22N) is the flexible substrate positioned on the outermost side. The N-th flexible substrate (22N) extends from the (N−1)-th flexible substrate (22(N−1)). The N-th flexible substrate (22N) is wound around the (N−1)-th flexible substrate (22(N−1)).

A length (predetermined length) of the flexible substrate for one turn is L1. The length (L1) is illustrated in FIG. 2A. As illustrated in FIG. 2A, the length (L1) is represented by a length of the first flexible substrate 221. Or, the length (L1) is represented by an average value of the lengths of the flexible substrates that respectively form the turns. By adjusting the predetermined interval 220, L/L1 can be freely adjusted. For example, L/L1 can be adjusted to an integer equal to or greater than 2. In that case, the lengths of the flexible substrates that are respectively formed in the turns are substantially equal to each other. The N-th flexible substrate (22N) substantially completely covers the (N−1)-th flexible substrate (22(N−1)). L, L1, and N satisfy the following relationship 1:

$$L \approx N \times L1 \qquad \text{Relationship 1:}$$

In the example of FIG. 1B, N is 2. The coil substrate 201 is wound for exactly 2 turns. The length (L) of the flexible substrate 22 is 2×L1.

Coils (C) are formed on each flexible substrate. Each coil substrate is formed by each flexible substrate and the coils (C) on the each flexible substrate. For example, a first coil substrate 2011 is formed by the first flexible substrate 221 and the coils (C) on the first flexible substrate 221. The N-th coil substrate (201N) is formed by the N-th flexible substrate (22N) and the coils (C) on the N-th flexible substrate (22N). In the first to (N−1)-th coil substrates, the coils (C) on each flexible substrate are substantially evenly positioned. On the other hand, in the N-th coil substrate (201N), the coils (C) on the N-th flexible substrate (22N) are not evenly positioned. The N-th flexible substrate (22N) has the predetermined interval 220 that includes the other end (22R). Therefore, by adjusting a length of the predetermined interval 220, a length (LN) of the N-th flexible substrate (22N) can be freely adjusted.

In the example of FIGS. 2A and 2B, the flexible substrate 22 is formed of the first flexible substrate 221 and the second flexible substrate 222 that extends from the first flexible substrate 221. The first to fourth coils (C1, C2 C3, C4) are formed on the first flexible substrate 221. The fifth and sixth coils (C5, C6) are formed on the first and second flexible substrates (221, 222). The length of the first flexible substrate 221 is L1. The length (L1) of the first flexible substrate 221 and the predetermined length are equal to each other. In the example of FIGS. 2A and 2B, the length (L1) is a distance between the one end (22L) of the flexible substrate 22 and the other end (52E) of the fourth coil (C4). A length of the second flexible substrate 222 is L2. In the example of FIGS. 2A and 2B, the length (L2) is a distance between the other end (22R) of the flexible substrate 22 and the other end (52E) of the fourth coil (C4). The length (L2) of the second flexible substrate 222 and the predetermined length (L1) are substantially equal to each other.

The length (L3) of the sub portion (22-2) and the length (LN) of the N-th flexible substrate (22N) are compared. In FIGS. 2A and 2B, the length (LN) of the N-th flexible substrate (22N) is the length (L2). The K-th coil (CK) is formed on the N-th flexible substrate (22N). The length (L3) of the sub portion (22-2) is a distance between the other end (52E) of the K-th coil (CK) and the other end (22R) of the flexible substrate 22. Therefore, the length (LN) of the N-th flexible substrate (22N) is longer than the length of the sub portion (22-2) (the length of the predetermined interval) (L3). The length (L3) of the predetermined interval is larger than the width (W) of each of the coils (C). The length (L3) of the predetermined interval is about a half of the predetermined length (L1). The N-th coil substrate 20N can have lightness and strength.

As illustrated in FIG. 1A, a motor 10 is obtained by positioning a magnet 48 inside the motor coil substrate 20. FIG. 1A is a schematic diagram. The motor coil substrate 20 is positioned around the magnet 48 via the hollow space (AH). An example of the motor 10 is a brushless motor. In the embodiment, the magnet 48 rotates. However, it is also possible that the motor coil substrate 20 rotates. A rotation direction (MR) of the motor 10 is illustrated in FIG. 1B.

FIG. 3A illustrates a cross section of the motor coil substrate 20 obtained by cutting the motor 10 in a plane parallel to the rotation direction (MR) of the motor 10. FIG. 3A is a schematic diagram. In FIG. 3A, the coils (C) are omitted and only the flexible substrate 22 is drawn.

As illustrated in FIG. 3A, the motor coil substrate 20 has a thickness (MT), and the thickness (MT) of the motor coil substrate 20 is measured in the cross section. The thickness (MT) of the motor coil substrate 20 includes the flexible substrates positioned in the turns. In the embodiment, the N-th flexible substrate (22N) has the predetermined interval of 220. Therefore, the length (LN) of the N-th flexible substrate (22N) and the predetermined length (L1) are substantially the same. The lengths of flexible substrates of the turns are substantially equal to each other. Therefore, by adjusting the length (L3) of the predetermined interval, the thickness (MT) of the motor coil substrate 20 can be made substantially equal from 0 degrees to 360 degrees. The motor coil substrate 20 can be reliably fixed in the motor 10.

Roundness of the motor coil substrate 20 can be increased. The roundness is observed in the cross section of the motor coil substrate 20. The motor coil substrate 20 smoothly rotates. When the motor coil substrate 20 rotates, energy loss can be reduced. Eccentricity is unlikely to occur.

In the example of FIG. 3A, the motor coil substrate 20 is manufactured by winding the coil substrate 201 illustrated in FIGS. 2A and 2B. The motor coil substrate 20 illustrated in FIG. 3A is formed of the first coil substrate 2011 and a second coil substrate 2012 wound around the first coil substrate 2011. And, the length (L1) of the first flexible substrate 221 and the length (L2) of the second flexible substrate 222 are equal to each other. Therefore, the coil substrate 201 is wound for exactly 2 turns. The thickness (MT) of the motor coil substrate 20 is substantially even.

When the flexible substrate 22 does not have the predetermined interval 220, the length (LN) of the N-th flexible substrate (22N) and the predetermined (L1) are unlikely to match each other. In that case, the length (LN) is shorter than the length (L1). Such a coil substrate is a reference example. By winding the coil substrate of the reference example, a motor coil substrate of the reference example is manufactured. FIG. 3D illustrates a schematic diagram of a cross section of the motor coil substrate of the reference example. As illustrated in FIG. 3D, the thickness (MT) of the motor coil substrate 20 is partially different. When the motor coil substrate 20 of FIG. 3D rotates, eccentricity is likely to occur.

FIG. 1B of Japanese Patent Application Laid-Open Publication No. 2019-140762 illustrates a developed view of a motor coil substrate. According to the figure, it is thought that coils are evenly positioned on an insulating substrate. FIG. 3D of Japanese Patent Application Laid-Open Publication No. 2019-140762 illustrates a cross section of the motor coil substrate. According to the figure, it is conceivable that an outer diameter (D1) differs depending on a measurement location.

A coil substrate according to an embodiment of the present invention includes: a flexible substrate having one end and the other end on the opposite side with respect to the one end; and multiple coils formed on the flexible substrate. The number of the coils is K, the coils are formed substantially in a row between the one end and the other end. The first coil is close to the one end. A predetermined distance is formed between the K-th coil and the other end. K is an integer equal to or greater than 2.

According to an embodiment of the present invention, a coil substrate is formed of the flexible substrate having the one end and the other end and the multiple coils on the flexible substrate. The number of the coils is K, and the predetermined interval is formed between the K-th coil and the other end. Therefore, the length of the coil substrate can be freely adjusted by adjusting the predetermined interval.

A motor coil substrate can be manufactured by winding a coil substrate according to an embodiment of the present invention. A length of the flexible substrate is L. The number of turns the coil substrate is wound is N. In the motor coil substrate, the flexible substrate positioned on an innermost side is a first flexible substrate. The flexible substrate positioned on an outermost side is an N-th flexible substrate. The N-th flexible substrate extends from an (N−1)-th flexible substrate. And, the N-th flexible substrate is wound around the (N−1)-th flexible substrate. A length of one turn of the flexible substrate is L1. By adjusting the predetermined interval, L/L1 can be adjusted. For example, L/L1 can be adjusted to an integer equal to or greater than 2. In that case, the lengths of the flexible substrates that are respectively formed in the turns are substantially equal to each other. The N-th flexible substrate substantially completely covers the (N−1)-th flexible substrate.

A motor is manufactured using a motor coil substrate according to an embodiment of the present invention and a magnet. When the motor coil substrate is cut in a plane parallel to a rotation direction of the motor, a cross section of the motor coil substrate is formed. The motor coil substrate has a thickness. The thickness of the motor coil substrate is measured in the cross section. The thickness of the motor coil substrate includes the flexible substrates positioned in the turns. Therefore, by adjusting the predetermined interval, the thickness of the motor coil substrate can be made substantially the same from 0 degrees to 360 degrees. Roundness of the motor coil substrate can be increased. The roundness is observed in the cross section of the motor coil substrate. The motor coil substrate smoothly rotates. When the motor coil substrate rotates, energy loss can be reduced. Eccentricity is unlikely to occur.

Obviously, numerous modifications and variations of the present invention are possible in light of the above teachings. It is therefore to be understood that within the scope of the appended claims, the invention may be practiced otherwise than as specifically described herein.

What is claimed is:

1. A coil substrate, comprising:
   a flexible substrate having a first end and a second end on an opposite side with respect to the first end; and
   a plurality of coils formed on the flexible substrate such that the plurality of coils is positioned substantially in a row between the first end and second end of the flexible substrate,
   wherein the plurality of coils is formed such that a number of coils of the plurality of coils is K and that the plurality of coils includes a first coil positioned close to the first end and a K-th coil positioned to form a distance between the K-th coil and the second end, where K is an integer equal to or greater than 2,
   wherein the plurality of coils is formed such that each of the coils has a center space and a plurality of wirings surrounding the center space and that the plurality of wirings includes a plurality of first circuits formed on a first surface of the flexible substrate, a plurality of second circuits formed on a second surface of the flexible substrate on an opposite side with respect to the first surface, and a plurality of via conductors penetrating through the flexible substrate and connecting the first circuits and the second circuits, the plurality of wirings in each of the coils is formed such that one first circuit, one via conductor, and one second circuit form a 1-turn coil, and the plurality of coils is formed such that the plurality of second circuits in a (m−1)-th coil is positioned below the center space of a m-th coil and that the plurality of first circuits in a (m+1)-th coil is positioned above the center space of the m-th coil, where m is an integer equal to or greater than 2.

2. The coil substrate according to claim 1, wherein the flexible substrate includes a main portion and a sub portion extending from the main portion such that the sub portion forms an interval and that the plurality of coils is not formed on the sub portion of the flexible substrate.

3. The coil substrate according to claim 2, wherein the flexible substrate is a single flexible substrate comprising the main portion and sub portion forming parts of the single flexible substrate.

4. The coil substrate according to claim 3, wherein the plurality of coils includes a U-phase coil, a V-phase coil, and a W-phase coil.

5. The coil substrate according to claim 2, wherein the plurality of coils includes a U-phase coil, a V-phase coil, and a W-phase coil.

6. A motor coil substrate, comprising:
   the coil substrate of claim 5 wound for N turns,
   wherein the flexible substrate has a length that is N times a length of one turn of the N turns and that a length of the sub portion is shorter than the length of one turn of the N turns, where N is an integer equal to or greater than 2.

7. The motor coil substrate according to claim 6, wherein the flexible substrate includes a first flexible substrate and a second flexible substrate extending from the first flexible substrate such that the first flexible substrate is a part of the main portion of the flexible substrate, that the sub portion of the flexible substrate is a part of the second flexible substrate, and that the second flexible substrate is wound around the first flexible substrate, and the flexible substrate is formed such that a length of the first flexible substrate is substantially equal to the length of one turn of the N turns, that a length of the second flexible substrate is substantially equal to the length of one turn of the N turns, and that the K-th coil is formed on the second flexible substrate.

8. A motor coil substrate, comprising:
   the coil substrate of claim 2 wound for N turns,
   wherein the flexible substrate has a length that is N times a length of one turn of the N turns and that a length of the sub portion is shorter than the length of one turn of the N turns, where N is an integer equal to or greater than 2.

9. The motor coil substrate according to claim 8, wherein the flexible substrate includes a first flexible substrate and a second flexible substrate extending from the first flexible substrate such that the first flexible substrate is a part of the main portion of the flexible substrate, that the sub portion of the flexible substrate is a part of the second flexible substrate, and that the second flexible substrate is wound around the first flexible substrate, and the flexible substrate is formed such that a length of the first flexible substrate is substantially equal to the length of one turn of the N turns, that a length of the second flexible substrate is substantially equal to the length of one turn of the N turns, and that the K-th coil is formed on the second flexible substrate.

10. The motor coil substrate according to claim 9, wherein the flexible substrate is formed such that the interval is larger than a width of each of the coils.

11. The motor coil substrate according to claim 9, wherein the flexible substrate is formed such that the interval is about a half of the length of one turn of the N turns.

12. The coil substrate according to claim 1, wherein the plurality of coils includes a U-phase coil, a V-phase coil, and a W-phase coil.

13. A motor coil substrate, comprising:
   the coil substrate of claim 12 wound for N turns,
   wherein the flexible substrate has a length that is N times a length of one turn of the N turns and that a length of the sub portion is shorter than the length of one turn of the N turns, where N is an integer equal to or greater than 2.

14. The motor coil substrate according to claim 13, wherein the flexible substrate includes a first flexible substrate and a second flexible substrate extending from the first flexible substrate such that the first flexible substrate is a part of the main portion of the flexible substrate, that the sub portion of the flexible substrate is a part of the second flexible substrate, and that the second flexible substrate is wound around the first flexible substrate, and the flexible substrate is formed such that a length of the first flexible substrate is substantially equal to the length of one turn of the N turns, that a length of the second flexible substrate is substantially equal to the length of one turn of the N turns, and that the K-th coil is formed on the second flexible substrate.

15. The motor coil substrate according to claim 14, wherein the flexible substrate is formed such that the interval is larger than a width of each of the coils.

16. The motor coil substrate according to claim 14, wherein the flexible substrate is formed such that the interval is about a half of the length of one turn of the N turns.

17. A motor coil substrate, comprising:
a coil substrate comprising a flexible substrate having a first end and a second end on an opposite side with respect to the first end, and a plurality of coils formed on the flexible substrate such that the plurality of coils is positioned substantially in a row between the first end and second end of the flexible substrate,
wherein the plurality of coils is formed such that a number of coils of the plurality of coils is K and that the plurality of coils includes a first coil positioned close to the first end and a K-th coil positioned to form a distance between the K-th coil and the second end, where K is an integer equal to or greater than 2, the flexible substrate includes a main portion and a sub portion extending from the main portion such that the sub portion forms an interval and that the plurality of coils is not formed on the sub portion of the flexible substrate, the coil substrate is wound for N turns, and the flexible substrate has a length that is N times a length of one turn of the N turns and that a length of the sub portion is shorter than the length of one turn of the N turns, where N is an integer equal to or greater than 2.

18. The motor coil substrate according to claim 17, wherein the flexible substrate includes a first flexible substrate and a second flexible substrate extending from the first flexible substrate such that the first flexible substrate is a part of the main portion of the flexible substrate, that the sub portion of the flexible substrate is a part of the second flexible substrate, and that the second flexible substrate is wound around the first flexible substrate, and the flexible substrate is formed such that a length of the first flexible substrate is substantially equal to the length of one turn of the N turns, that a length of the second flexible substrate is substantially equal to the length of one turn of the N turns, and that the K-th coil is formed on the second flexible substrate.

19. The motor coil substrate according to claim 18, wherein the flexible substrate is formed such that the interval is larger than a width of each of the coils.

20. The motor coil substrate according to claim 18, wherein the flexible substrate is formed such that the interval is about a half of the length of one turn of the N turns.

\* \* \* \* \*